(12) United States Patent
Fujii

(10) Patent No.: US 8,035,192 B2
(45) Date of Patent: Oct. 11, 2011

(54) SEMICONDUCTOR DEVICE AND MANUFACTURING METHOD THEREOF

(75) Inventor: Tomoharu Fujii, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 177 days.

(21) Appl. No.: 12/342,755

(22) Filed: Dec. 23, 2008

(65) Prior Publication Data

US 2009/0166811 A1 Jul. 2, 2009

(30) Foreign Application Priority Data

Dec. 27, 2007 (JP) ................................. 2007-335690

(51) Int. Cl.
*H01L 27/08* (2006.01)

(52) U.S. Cl. .. 257/531; 257/347; 257/621; 257/E27.112

(58) Field of Classification Search .................. 257/621, 257/698, 700, 702, 758, 760, 773, E23.067, 257/347, 508, 531, 659, E21.022, E27.112, 257/E21.597, E23.011
See application file for complete search history.

(56) References Cited

U.S. PATENT DOCUMENTS

2008/0020488 A1* 1/2008 Clevenger et al. ................ 438/3

FOREIGN PATENT DOCUMENTS

| | | |
|---|---|---|
| JP | 2004-22667 | 1/2004 |
| JP | 2007-36571 | 2/2007 |

* cited by examiner

*Primary Examiner* — Minh-Loan T Tran
*Assistant Examiner* — Leslie Pilar Cruz
(74) *Attorney, Agent, or Firm* — Drinker Biddle & Reath LLP

(57) ABSTRACT

A semiconductor device has a semiconductor chip and through electrodes formed passing through the semiconductor chip. A ground layer connected to the through electrode and a patch antenna connected to the through electrode are provided through an inorganic insulating layer formed of $SiO_2$ or SiN on a second face opposite to a first face (main face) of the semiconductor chip.

9 Claims, 19 Drawing Sheets

SEMICONDUCTOR DEVICE AND MANUFACTURING METHOD THEREOF

TECHNICAL FIELD

The present disclosure relates to a semiconductor device and a manufacturing method thereof and in particular to a semiconductor device including a passive element and a manufacturing method of the semiconductor device.

RELATED ART

Some semiconductor devices include an antenna as a passive element. Such a semiconductor device includes a board and a CPU semiconductor chip, an RF device, etc., provided on the board; it is used, for example, as a wireless module. A chip antenna, an antenna pattern, etc., is use as the antenna.

FIG. 1 is a sectional view of a semiconductor device in a related art including a chip antenna. As shown in the figure, a semiconductor device 100 has a board 101, a CPU semiconductor chip 102, an RF device 103, a chip antenna 104, and a matching component 105.

The board 101 is formed with a wiring pattern not shown. The CPU semiconductor chip 102, the RF device 103, the chip antenna 104, and the matching component 105 are provided on the board 101. The matching component 105 is electrically connected to the RF device and the chip antenna 104 by the wiring pattern (not shown) provided on the board 101.

FIG. 2 is a sectional view of a semiconductor device in a related art including an antenna pattern. Components identical with those of the semiconductor device 100 shown in FIG. 1 are denoted by the same reference numerals in FIG. 2.

As shown in FIG. 2, a semiconductor device 110 has a board 101, a CPU semiconductor chip 102, an RF device 103, and an antenna pattern 111. The CPU semiconductor chip 102 and the RF device 103 are provided on the board 101. The antenna pattern 111 is formed on the board 101 and is electrically connected to the CPU semiconductor chip 102 and the RF device 103 by a wiring pattern (not shown) provided on the board 101. (For example, refer to patent document 1.)

A semiconductor device having a CPU and an RF device mixed on one semiconductor chip and an antenna formed on the back of the semiconductor chip has been proposed with the advance of CMOS technology in recent years.

[Patent document 1] Japanese Patent Laid-Open No. 2004-22667

However, the semiconductor device 100 described above involves a problem of an increase in the manufacturing cost of the semiconductor device 100 because the chip antenna 104 is expensive. To use the chip antenna 104, the matching component 105 for adjusting an impedance needs to be provided and thus the area of the board 101 grows, the cost of the semiconductor device 100 increases, and the semiconductor device 100 cannot be miniaturized; this is a problem.

In the semiconductor device 110, to form the antenna pattern 111, a larger area than the formation area of the chip antenna 104 becomes necessary on the board 101 and thus the area of the board 101 grows, the cost of the semiconductor device 110 increases, and the semiconductor device 110 cannot be miniaturized; this is a problem.

The semiconductor device having a CPU and an RF device mixed on one semiconductor chip and an antenna formed on the back of the chip can be miniaturized drastically as compared with the semiconductor devices 100 and 110. Inevitably, an insulating material needs to be provided between the antenna and the semiconductor chip, however, since the semiconductor chip and the antenna pattern are isolated using an insulating resin in the related art, the dielectric loss is large because of the insulating resin and any desired antenna characteristic cannot be provided; this is a problem. Particularly, for a millimeter waveband antenna, the dielectric loss becomes a large problem.

SUMMARY

Exemplary embodiments of the present invention provide a semiconductor device capable of suppressing occurrence of a dielectric loss if the device is miniaturized and a manufacturing method of the semiconductor device.

To the end, according to a first aspect of the invention, there is provided a semiconductor device comprising:

a semiconductor element;

a through electrode formed passing through the semiconductor element;

an inorganic insulating layer formed on an opposite side to a main face of the semiconductor element on which an element formation layer is formed; and a passive layer connected to the through electrode, the passive layer provided through the inorganic insulating layer on the opposite side to the main face of the semiconductor element.

In the invention, a ground layer connected to the through electrode may be provided on the opposite side to the main face of the semiconductor element and the inorganic insulating layer may be provided on the ground layer. The inorganic insulating layer can use $SiO_2$ or SiN. The passive layer can use an antenna selected from the group consisting of a patch antenna, an inverted F antenna, and a dipole antenna. Further, re-wiring may be formed on the main face of the semiconductor element.

To the end, according to a second aspect of the invention, there is provided a manufacturing method of a semiconductor device, comprising the steps of:

forming a through hole in a semiconductor substrate;

forming a through electrode in the through hole;

forming an inorganic insulating layer on an opposite side to a main face of the semiconductor substrate on which an element formation layer is formed;

forming a passive layer on the inorganic insulating layer; and cutting the semiconductor substrate to provide separate semiconductor devices.

In the invention, the manufacturing method may further include the steps of forming a ground layer on the opposite side to the main face of the semiconductor substrate and covering the ground layer and forming the inorganic insulating layer. The inorganic insulating layer may be formed of $SiO_2$ or SiN. The manufacturing method may further include the step of forming an external connection terminal electrically connected to the through electrode on the main face of the semiconductor substrate.

According to the invention, the device can be miniaturized. The ground layer and the passive layer are provided through the inorganic insulating layer having a small dielectric loss as compared with a resin insulating layer, so that delay occurrence of signal transfer can be suppressed and therefore the antenna characteristic can be improved.

Other features and advantages may be apparent from the following detailed description, the accompanying drawings and the claims.

DETAILED DESCRIPTION

The best mode for carrying out the invention will be discussed with the accompanying drawings.

Figure 1:
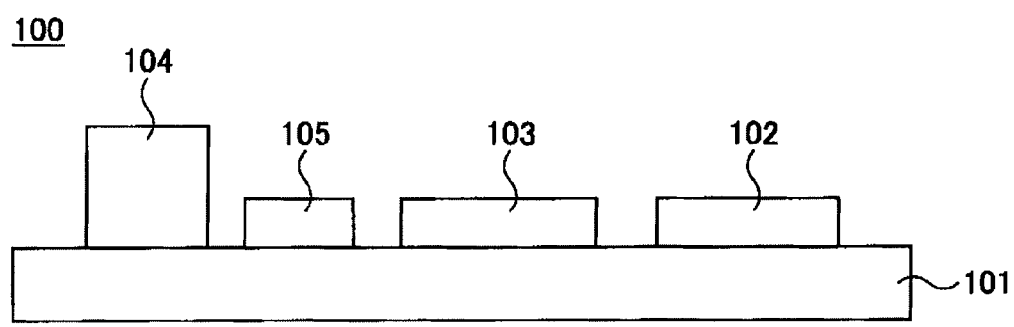
FIG. 1 is a sectional view of a semiconductor device in a related art including a chip antenna.
Figure 2:
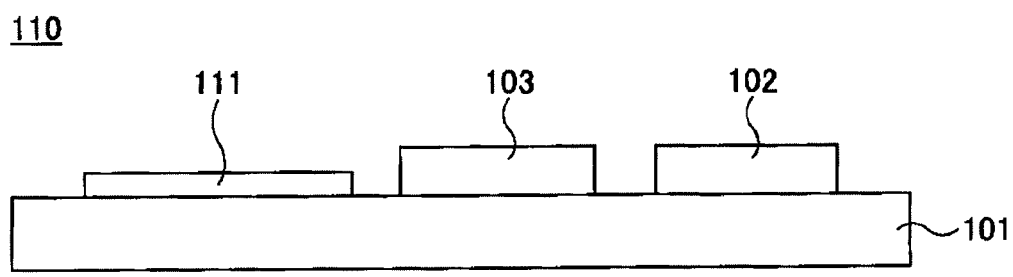
FIG. 2 is a sectional view of a semiconductor device in a related art including an antenna pattern.
Figure 3:
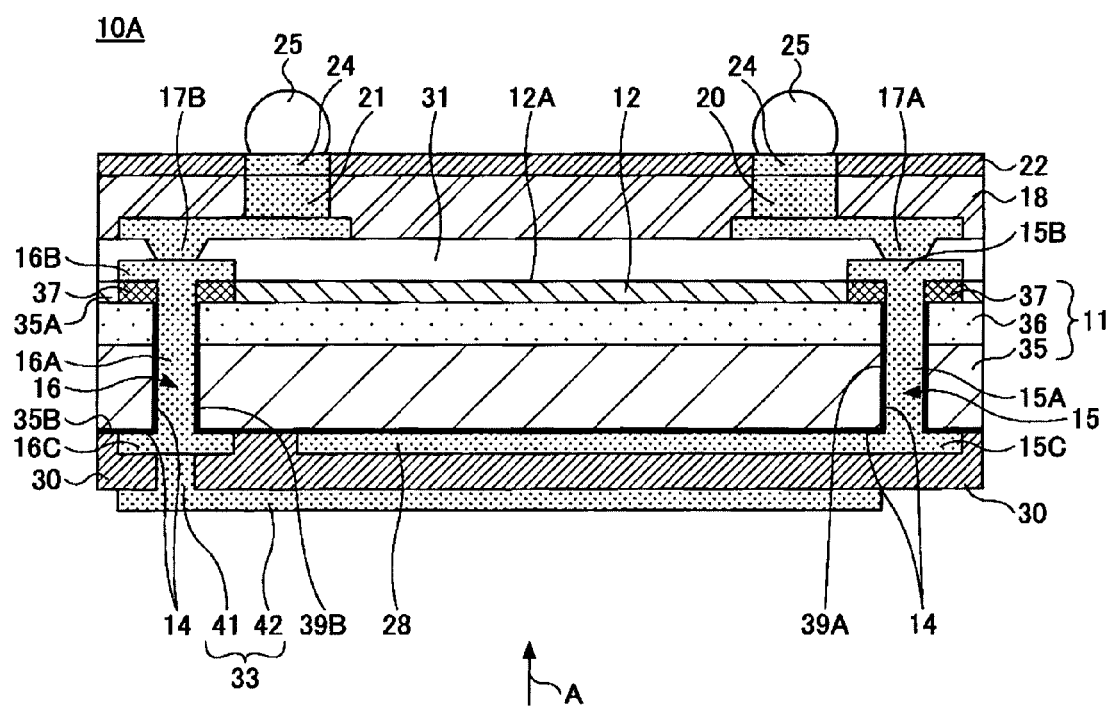
FIG. 3 is a sectional view of a semiconductor device according to a first embodiment of the invention.

FIG. 3 is a sectional view of a semiconductor device according to a first embodiment of the invention. A semiconductor device 10A is electrically connected to a mount board (not shown) such as a mother board, for example, through external connection terminals 25. In the description of the embodiment, the case where a patch antenna 33 is used as a passive element is taken as an example.

The semiconductor device 10A has a semiconductor chip 11, a protective film 12, an insulating film 14, a solder resist 22, through electrodes 15 and 16, re-wirings 17A and 17B, a seal resin 18, posts and 21, a diffusion prevention film 24, the above-mentioned external connection terminals 25, a ground layer 28, an inorganic insulating layer 30, and the above-mentioned patch antenna 33 as a passive element.

The semiconductor chip 11 has a semiconductor substrate 35, an element formation layer 36, electrode pads 37, through holes 39A and 39B passing through the electrode pads 37, and the like. The semiconductor substrate 35 is shaped like a plate and uses an Si substrate, a Ga—As substrate, etc., for example.

The element formation layer 36 is formed on a main face 35A of the semiconductor substrate 35 (which will be hereinafter referred to as the first face 35A). The element formation layer 36 is formed with a CPU circuit, an RF circuit, and the like. An insulating layer, wiring, vias, and the like are formed on the circuit and a multilayer interconnection structure (not shown) is provided as a whole. For convenience of the drawing, the element formation layer 36 is drawn thicker than the actual thickness of the element formation layer 36 in the drawing.

The plurality of electrode pads 37 are provided on the element formation layer 36. The electrode pads 37 are electrically connected to a semiconductor element (not shown). For example, Al can be used as a material of the electrode pad 37.

The protective film 12 is provided so as to cover the top of the element formation layer 36 with the electrode pads 37 exposed. As the protective film 12, an $SiO_2$ film, an SiN film, etc., formed by a sputtering method, vacuum evaporation, a CVD method, etc., for example, can be used.

The insulating film 14 is provided so as to cover the semiconductor substrate 35 and the element formation layer 36 to form the through holes 39A and 39B and a second face 35B of the semiconductor substrate 35. The insulating film 14 insulates the through electrodes 15 and 16 and the semiconductor substrate 35 and the element formation layer 36. As the insulating film 14, for example, a thermal oxidation film of an $SiO_2$ film, etc., can be used. The insulating film 14 can be formed not only by thermal oxidation, but also by a CVD method, vacuum evaporation, etc.

The through electrode 15 has a through part 15A and connection parts 15B and 15C and is electrically connected to a ground line of a semiconductor element. The through part 15A is provided in the through hole 39A formed in the semiconductor substrate 35.

The connection part 15B is provided at an end part of the through part 15A positioned on the first face 35A side of the semiconductor substrate 35 and is electrically connected to the electrode pad 37. The connection part 15C is provided at an end part of the through part 15A positioned on the second face 35B side of the semiconductor substrate 35 and is electrically connected to the ground layer 28. Accordingly, the through electrode 15 and the ground layer 28 are placed at ground potential. Electrically conductive metal can be used as a material of the through electrode 15. Specifically, Cu can be used.

The through electrode 16 has a through part 16A and connection parts 16B and 16C. The through part 16A is provided in the through hole 39B formed in the semiconductor substrate 35.

The connection part 16B is provided at an end part of the through part 16A positioned on the first face 35A side of the semiconductor substrate 35 and is electrically connected to the electrode pad 37. The connection part 16C is provided at an end part of the through part 16A positioned on the second face 35B side of the semiconductor substrate 35 and is connected to the patch antenna 33. Electrically conductive metal can be used as a material of the through electrode 16. Specifically, Cu can be used.

Thus, the through electrodes 15 and 16 passing through the semiconductor chip 11 are provided, whereby it is made possible to provide a structure on the second face 35B side of the semiconductor substrate 35 and electrically connect a structure provided on the first face 35A side of the semiconductor substrate 35 and the structure provided on the second face 35B side.

The re-wiring 17A is provided through an insulating layer 31 on the protective film 12 and the connection part 15B. It is electrically connected to the through electrode 15 and the post 20. The re-wiring 17A is wiring for electrically connecting the post 20 electrically connected to the external connection terminal 25 and the through electrode 15.

The re-wiring 17B is provided through the insulating layer 31 on the protective film 12 and the connection part 16B. It is electrically connected to the through electrode 16 and the post 21. The re-wiring 17B is wiring for electrically connecting the post 21 electrically connected to the external connection terminal 25 and the through electrode 16.

The re-wiring 17A and the re-wiring 17B are thus provided, whereby when the semiconductor device 10A is connected to a mount board of a mother board, etc., (not shown), the disposition positions of the external connection terminals 25 can be adjusted so as to correspond to the spacing of pads provided on the mount board. The re-wiring 17A and the re-wiring 17B can also be formed directly on the protective film 12.

The seal resin 18 is provided so as to cover the protective film 12 and the re-wiring 17A and the re-wiring 17B. As the seal resin 18, for example, a seal resin made of an epoxy-based resin, a polyimide-based resin, etc., formed by a transfer mold method, laying up of a resin film, etc.

The post 20 is provided on the re-wiring 17A electrically connected to the through electrode 15 and is embedded in the seal resin 18. The top face of the post 20 is exposed from the seal resin 18 and the diffusion prevention film 24 is formed at the exposure position.

The post 21 is provided on the re-wiring 17B electrically connected to the through electrode 16 and is embedded in the seal resin 18. The top face of the post 21 is exposed from the seal resin 18 and the diffusion prevention film 24 is formed at the exposure position. Electrically conductive metal can be used as a material of the post 20, 21; for example, Cu can be used.

The solder resist 22 is provided so as to cover the seal resin 18 with the diffusion prevention film 24 exposed. As the solder resist 22, for example, an epoxy-based resin, a polyimide-based resin, etc., can be used. The solder resist 22 need not necessarily be provided.

The diffusion prevention film 24 is provided on the top face of the post 20, 21 exposed from the seal resin 18. It is a film for preventing Cu contained in the post 20, 21 from diffusing into the external connection terminal 25. As the diffusion prevention film 24, for example, an Ni/Au deposition film with an Ni layer and an Au layer deposited in order can be used.

The external connection terminal 25 is provided on the diffusion prevention film 24. It is electrically connected to either of the through electrodes 15 and 16. The external connection terminal 25 is a terminal for electrically connecting to a mount board of a mother board, etc. For example, a solder ball can be used as the external connection terminal 25.

The ground layer 28 is formed on the insulating film 14 covering the second face 35B of the semiconductor substrate 35 and is also connected to the connection part 15C. The formation area of the ground layer 28 is formed like a wide flat face. As mentioned above, the ground layer 28 is electrically connected to the through electrode 15, whereby it is placed at the ground potential. Electrically conductive metal can be used as a material of the ground layer 28; for example, Cu can be used.

The connection part 16C functions as a connection electrode for electrically connecting the through electrode 16 and the patch antenna 33. Accordingly, the patch antenna 33 is electrically connected to a feeding line of the semiconductor chip 11.

The inorganic insulating layer 30 is provided so as to cover the insulating film 14, the connection parts 15C and 16C, and the ground layer 28. In the embodiment, a material having a small dielectric loss ($\tan(\delta)$) (for example, in a range of 0.0001 to 0.01) is selected as the inorganic insulating layer 30. $SiO_2$ or SiN can be used as a specific material of the inorganic insulating layer 30. The dielectric loss ($\tan(\delta)$) of $SiO_2$ is about 0.0001. In contrast, the dielectric loss ($\tan(\delta)$) of a resin of polyimide, etc., is about 0.02. According to the embodiment, the dielectric loss ($\tan(\delta)$) can be drastically decreased as compared with that in the related arts. The inorganic insulating layer 30 can be formed using a sputtering method, vacuum evaporation, a CVD method, etc.

The patch antenna 33 is provided on the second face 35B of the semiconductor substrate 35 and has a via part 41 and an antenna part 42. The via part 41 is formed in the inorganic insulating layer 30. One end part of the via part 41 is connected to the through electrode 16 through the connection part 16C and an opposite end is connected to the antenna part 42 integrally. The antenna part 42 is exposed from the inorganic insulating layer 30.

Figure 4:
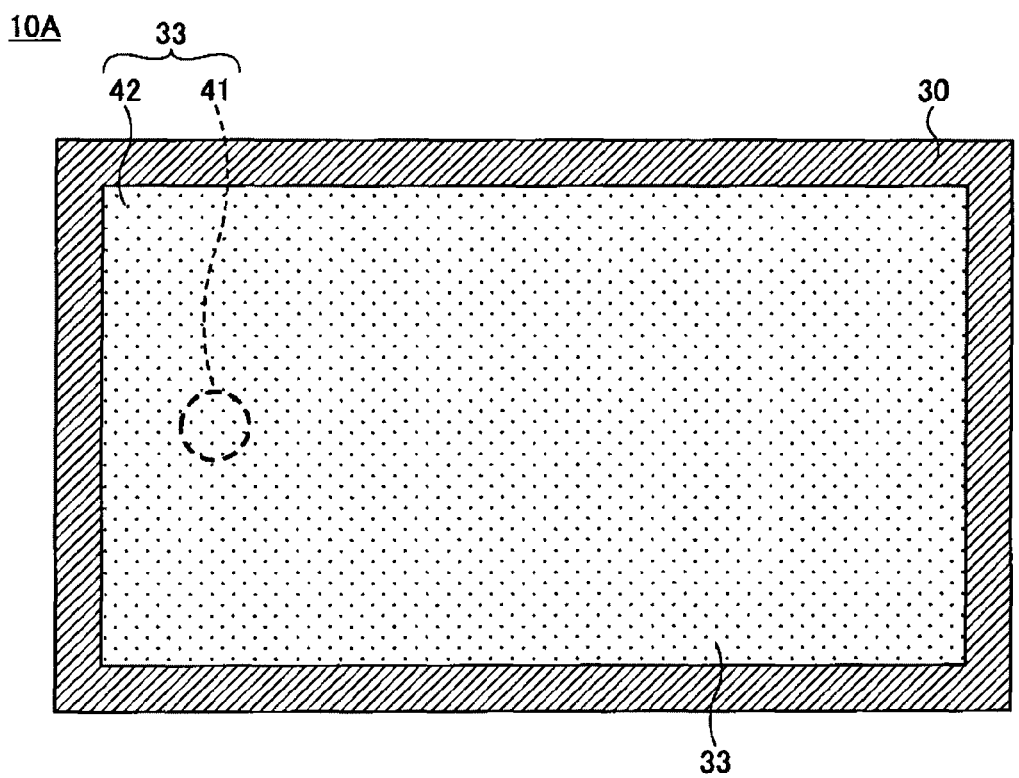
FIG. 4 is a plan view of the semiconductor device from A shown in FIG. 3.

FIG. 4 is a plan view of the semiconductor device 10A (from A in FIG. 3). As shown in FIGS. 3 and 4, the antenna part 42 is a flat plate antenna and is provided on the inorganic insulating layer 30 and the via part 41. Electrically conductive metal can be used as a material of the patch antenna 33; for example, Cu can be used.

The patch antenna 33 of a passive element is thus provided on the second face 35B of the semiconductor substrate 35 opposite to on the first face 35A of the semiconductor substrate 35 where the element formation layer 36 and the external connection terminals 25, whereby the size of the semiconductor device 10A in the area direction thereof (flat face size) can be miniaturized.

In the embodiment, the inorganic insulating layer 30 is used as an insulating layer for electromagnetically defining the ground layer 28 and the patch antenna 33. Generally, the inorganic insulating layer 30 made of $SiO_2$ or SiN has a small dielectric loss (tan(δ)) as compared with epoxy-based and polyimide-based insulating resins used in a semiconductor device. Therefore, the inorganic insulating layer 30 made of $SiO_2$ or SiN makes it possible to suppress delay occurrence of signal transfer, so that if the semiconductor device 10A is a device compatible with high frequencies of a millimeter waveband, the effect of the dielectric loss can be decreased and a good antenna characteristic can be provided.

By the way, in the configuration of the semiconductor device 10A according to the embodiment described above, the patch antenna 33 is exposed by way of example. However, an insulating film (for example, a solder resist) to cover and protect the patch antenna 33 may be provided on the surface of the patch antenna 33. The embodiment can also be applied to a semiconductor device not provided with the external connection terminals 25.

Figure 21:
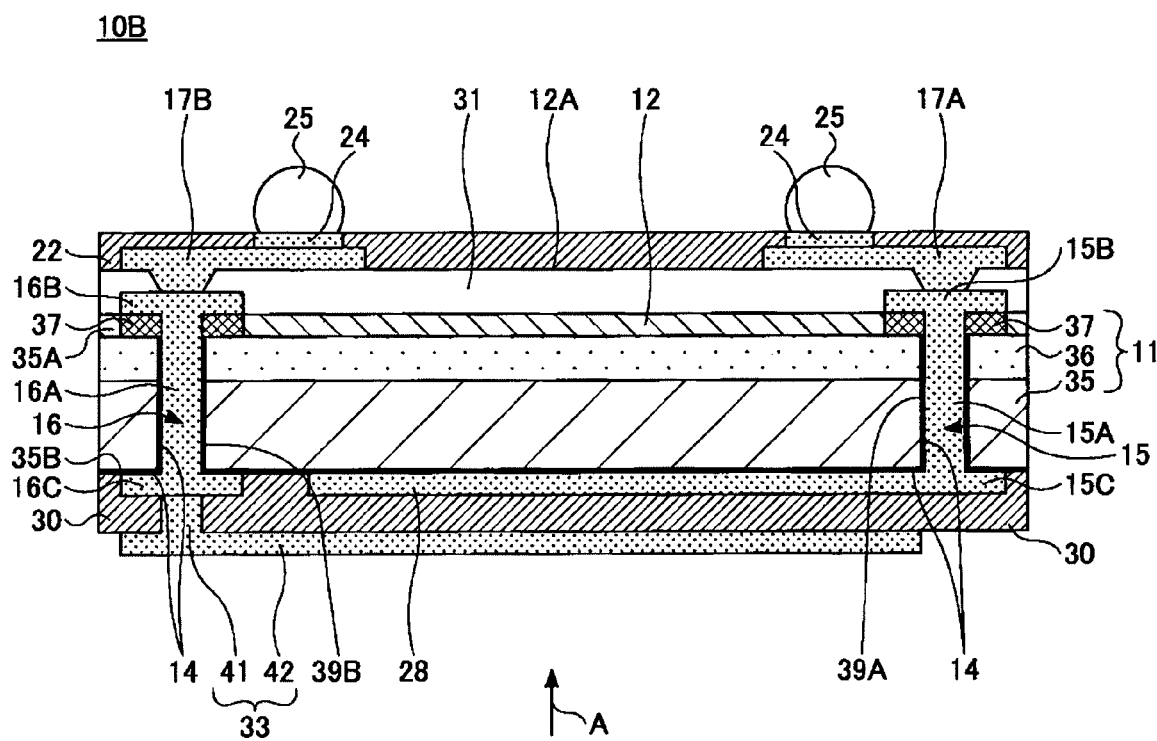
FIG. 21 is a sectional view of a semiconductor device according to a second embodiment of the invention.

As in a semiconductor device 10B according to a second embodiment of the invention shown in FIG. 21, the external connection terminals 25 may be formed directly on the re-wiring 17A and the re-wiring 17B through the diffusion prevention film 24 without providing the seal resin 18 or the post 20, 21. The semiconductor device 10B according to the second embodiment is the same as the semiconductor device 10A and therefore components identical with or similar to those shown in FIG. 3 are denoted by the same reference numerals in FIG. 21 and will not be discussed again.

Figure 22A:
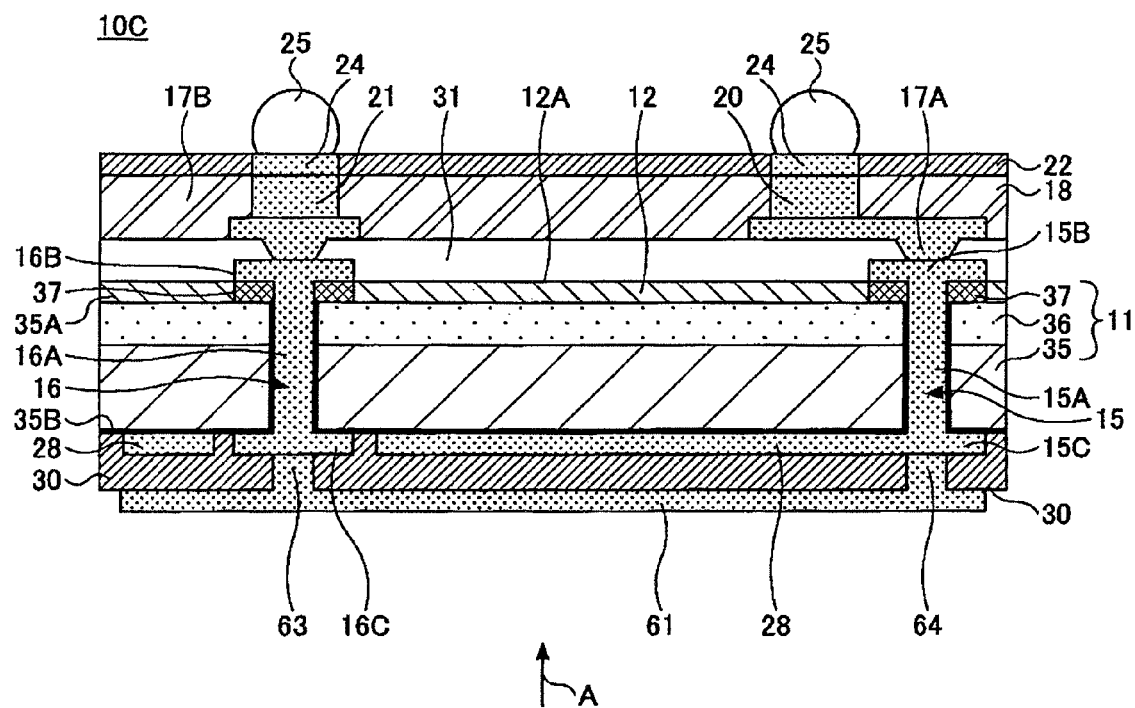
FIG. 22A shows a sectional view of a semiconductor device according to a third embodiment of the invention.
Figure 22B:
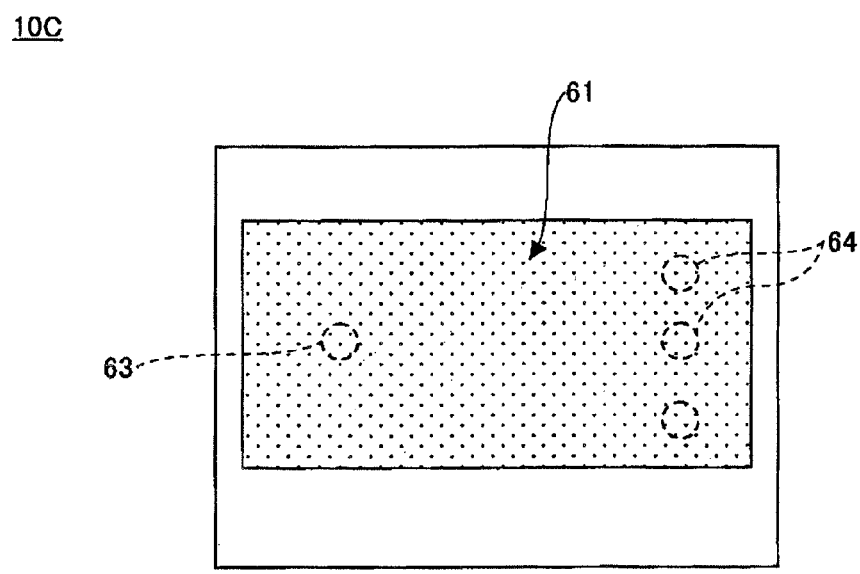
FIG. 22B shows a plan view of the semiconductor device according to the third embodiment of the invention.

Further, the antenna provided on the second face 35B of the semiconductor chip 11 is not limited to the patch antenna 33 and an inverted F antenna 61 may be applied as in a semiconductor device 10C according to a third embodiment of the invention shown in FIGS. 22A and 22B. In the semiconductor device 10C according to the third embodiment, the inverted F antenna 61 is connected to a through electrode 16 (connection part 16C) through a via 63 and is connected to a through electrode 15 (connection part 15C) through a via 64.

Figure 23A:
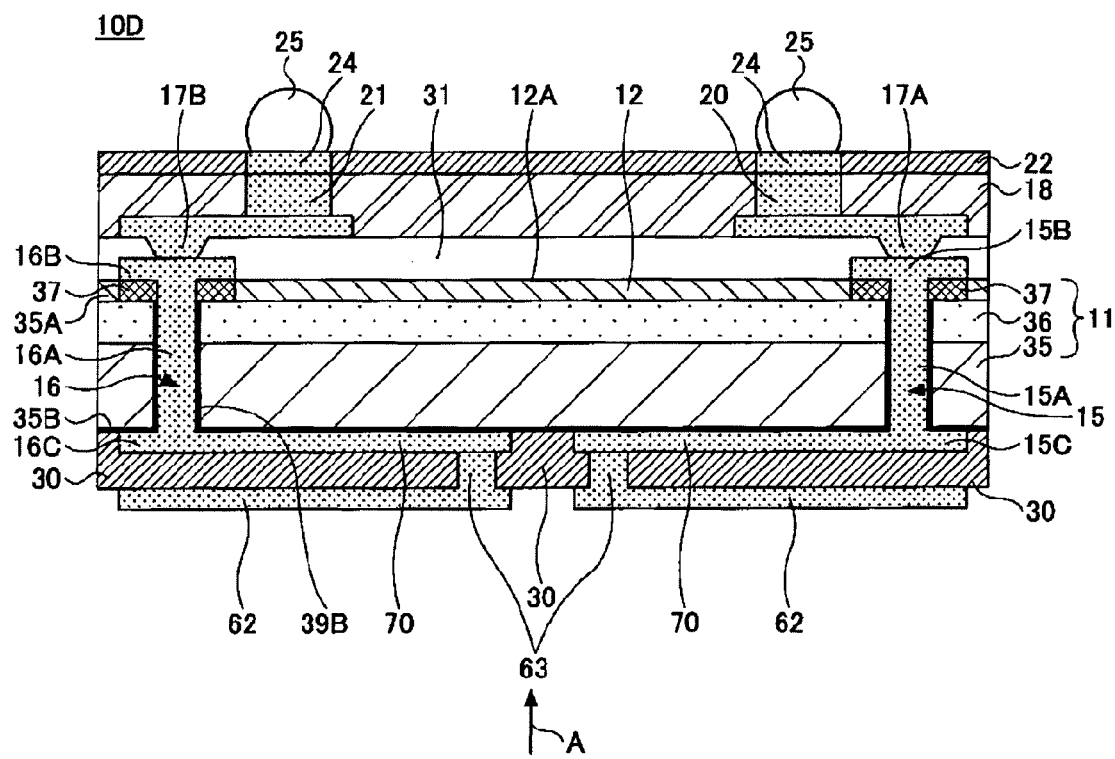
FIG. 23A shows a sectional view of a semiconductor device according to a fourth embodiment of the invention.
Figure 23B:
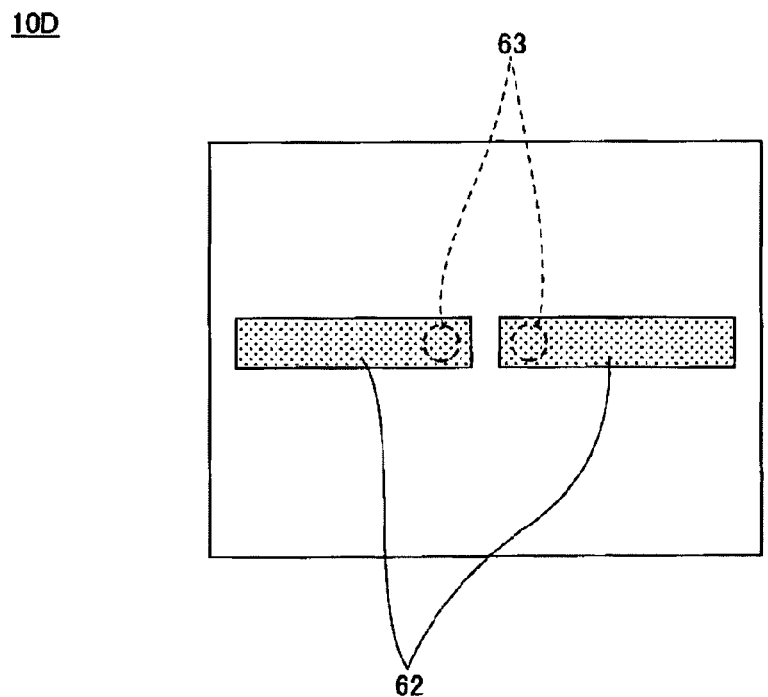
FIG. 23B shows a plan view of the semiconductor device according to the fourth embodiment of the invention.

A dipole antenna 62 can also be applied as the antenna as in a semiconductor device 10D according to a fourth embodiment of the invention shown in FIGS. 23A and 23B. The semiconductor device 10D according to the fourth embodiment is formed with re-wiring 70 continuous with a connection part 15C and the re-wiring 70 continuous with a connection part 16C. One dipole antenna 62 (at the right in the figure) is connected to a through electrode 15 (connection part 15C) through a via 63 and the re-wiring 70 and the other dipole antenna 62 (at the left in the figure) is connected to a through electrode 16 (connection part 16C) through the via 63 and the re-wiring 70. The passive layer is not limited to the antenna and any other electronic component such as a coil can also be a passive layer.

Next, a manufacturing method of the semiconductor device of the first embodiment of the invention will be discussed. FIGS. 5 to 20 are drawings to show the manufacturing method of the semiconductor device of the first embodiment.

In the description to follow, the manufacturing method of the semiconductor device 10A shown in FIG. 3 is taken as an example. Components corresponding to those previously described with reference to FIG. 3 are denoted by the same reference numerals in FIGS. 5 to 20 and will not be discussed again as required.

Figure 5:
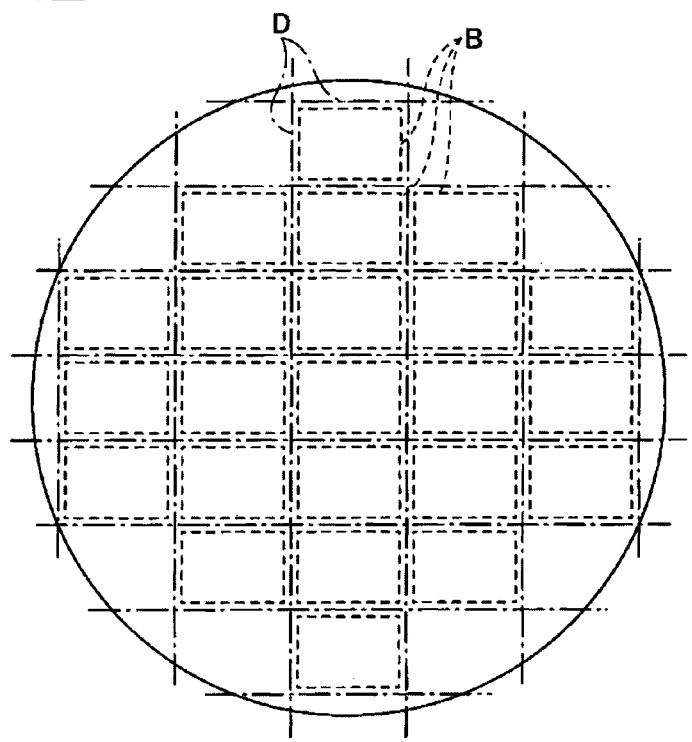
FIG. 5 is a drawing to show one example of a semiconductor substrate.

FIG. 5 is a drawing to show one example of a semiconductor substrate 11A as a base material of the semiconductor device 10A. In FIG. 5, D indicates a cut position when the semiconductor substrate 11A is cut with a dicing blade (cut position D). Each semiconductor device 10A is manufactured in a semiconductor device formation area B surrounded by the cut position D.

Figure 6:
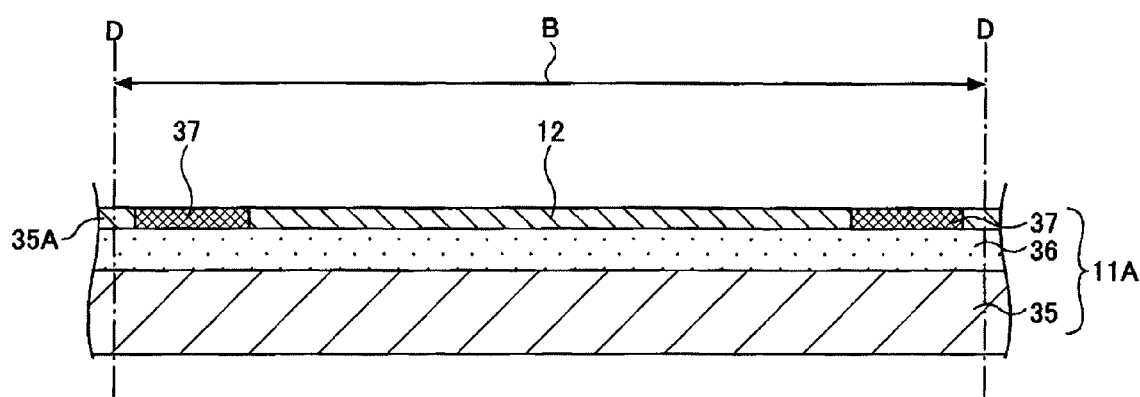
FIG. 6 is a drawing to show a manufacturing process of the semiconductor device according to the first embodiment of the invention (No. 1)

To manufacture the semiconductor device 10A, an element formation layer 36 is formed in the semiconductor device formation area B of a substrate main body 35 forming the semiconductor substrate 11A. Next, electrode pads 37 are formed on the element formation layer 36 and a protective film 12 is also formed, as shown in FIG. 6. At this time, the protective film 12 is formed so as to cover the full face of the element formation layer 36 except the formation positions of the electrode pads 37. The thickness of the protective film 12 is the same as that of the electrode pad 37.

The electrode pads 37 are formed as Al (aluminum) formed by a sputtering method is patterned by a dry etching method, for example. The protective film 12 can be formed by a sputtering method, vacuum evaporation, a CVD method, etc., for example. As the protective film 12, an $SiO_2$ film, an SiN film, etc., can be used, for example. Hereinafter, the electrode pads 37, the element formation layer 36, and the substrate main body 35 will be collectively called semiconductor substrate 11A.

Figure 7:
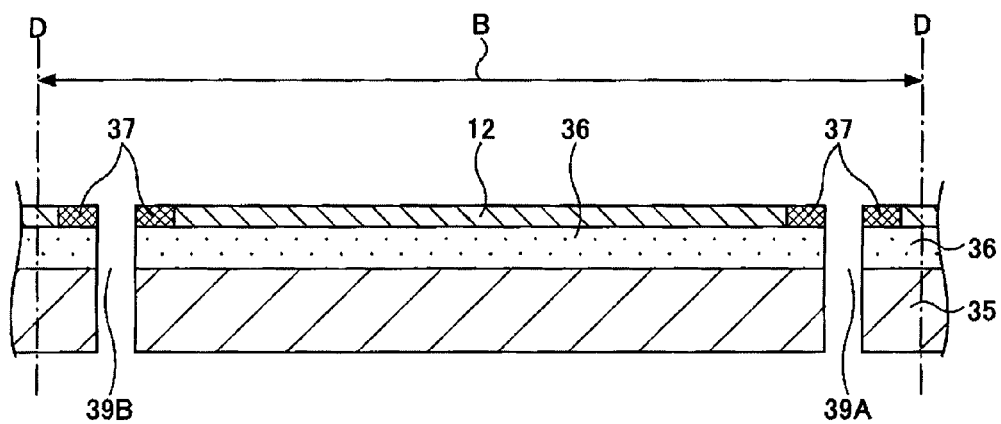
FIG. 7 is a drawing to show the manufacturing process of the semiconductor device according to the first embodiment of the invention (No. 2)

Next, through holes 39A and 39B passing through the semiconductor substrate 11A (substrate main body 35, element formation layer 36, and electrode pads 37) are formed as shown in FIG. 7. The through holes 39A and 39B can be formed using a laser machining method or dry etching, for example.

Figure 8:
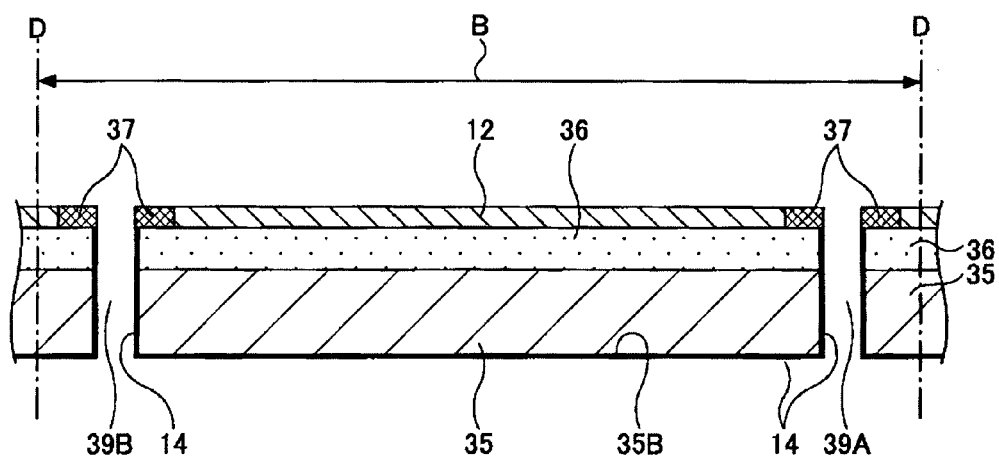
FIG. 8 is a drawing to show a manufacturing process of the semiconductor device according to the first embodiment of the invention (No. 3)

Next, the inner faces of the through holes 39A and 39B and a second face 35B of the substrate main body 35 are formed with an insulating film 14 as shown in FIG. 8. As the insulating film 14, a thermal oxidation film ($SiO_2$ film) formed by heating treatment or an $SiO_2$ film, an SiN film, etc., formed by a CVD method can be used, for example.

Figure 9:
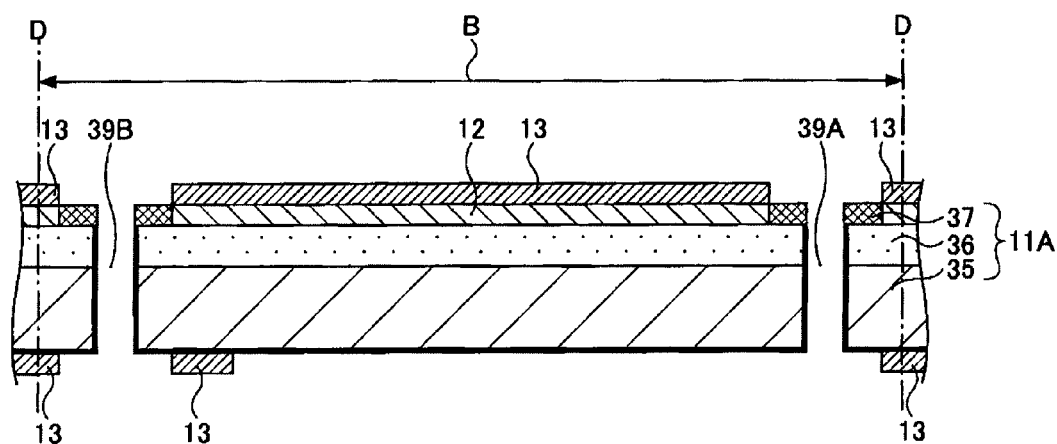
FIG. 9 is a drawing to show the manufacturing process of the semiconductor device according to the first embodiment of the invention (No. 4)

Next, using a CVD method, a seed layer of Ti or Cu (not shown) is formed on the full surfaces of the insulating film 14 containing the inner walls of the through holes 39A and 39B and the protective film 12 and then a plating resist 13 is formed as shown in FIG. 9. The plating resist 13 is patterned as shapes of connection parts 15B, 15C, 16B, and 16C and a ground layer 28.

Figure 10:
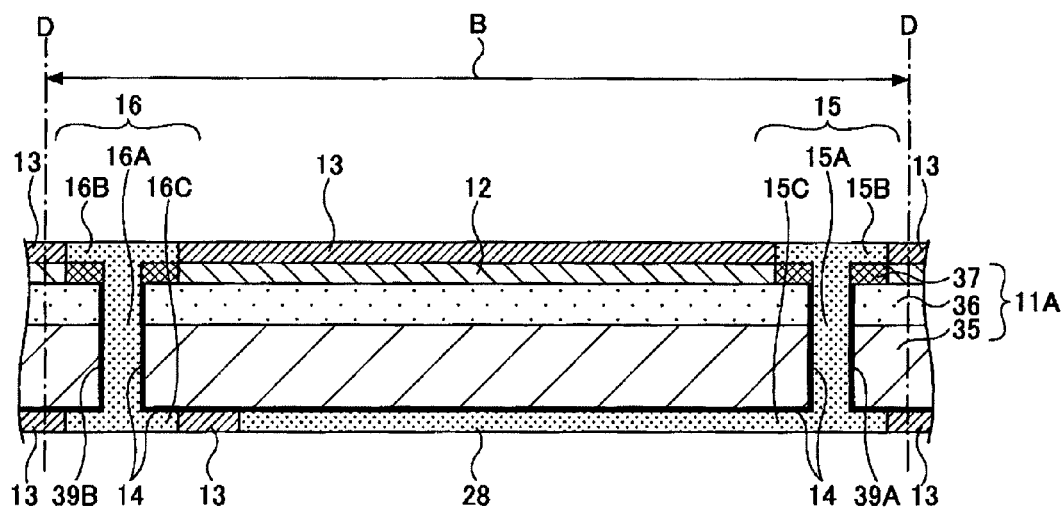
FIG. 10 is a drawing to show a manufacturing process of the semiconductor device according to the first embodiment of the invention (No. 5)

Next, electrolytic copper plating is executed with the seed layer of Ti or Cu formed as mentioned above as a feeding layer and a through electrode 15 (through part 15A, connection part 15B, connection part 15C), a through electrode 16 (through part 16A, connection part 16B, connection part 16C), and a ground layer 28 are formed as shown in FIG. 10. Therefore, the through electrodes 15 and 16 and the ground layer 28 are formed at the same time.

Figure 11:
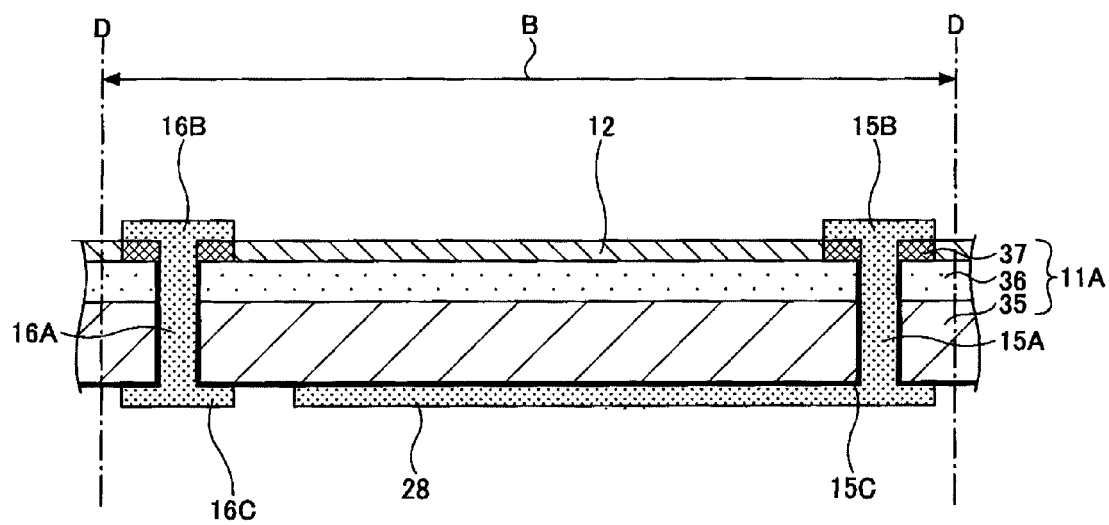
FIG. 11 is a drawing to show the manufacturing process of the semiconductor device according to the first embodiment of the invention (No. 6)

Next, the plating resist 13 is removed as shown in FIG. 11. Unnecessary seed layer exposed from the connection parts 15B, 15C, 16B, and 16C and the ground layer 28 is removed.

Figure 12:
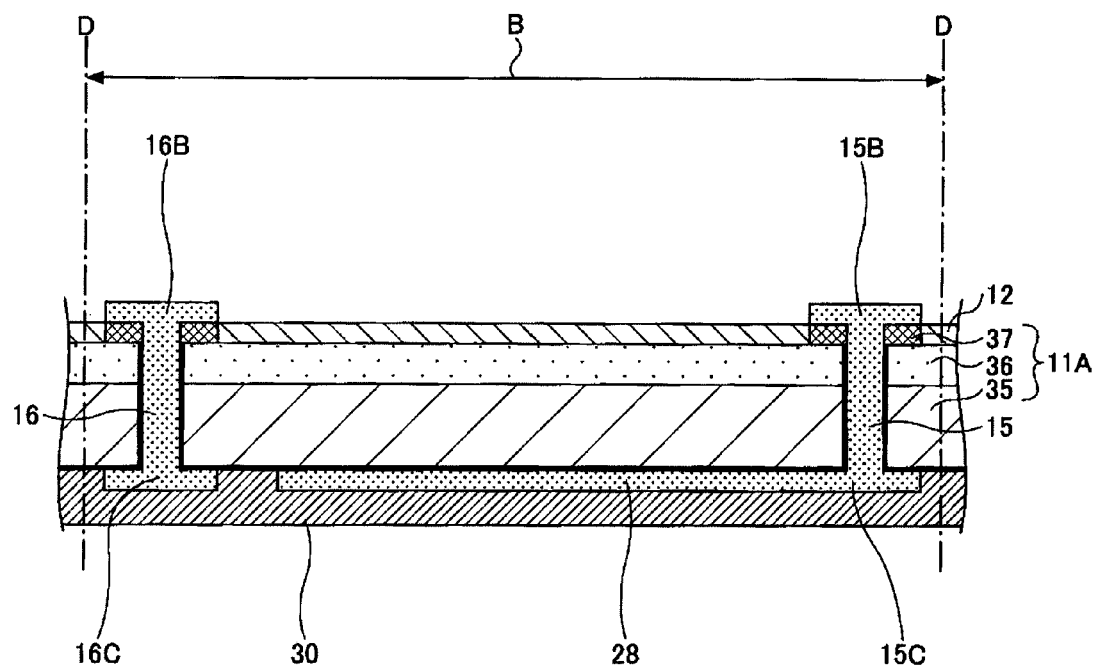
FIG. 12 is a drawing to show a manufacturing process of the semiconductor device according to the first embodiment of the invention (No. 7)

When the unnecessary seed layer is removed, an inorganic insulating layer 30 made of $SiO_2$ or SiN is formed by a CVD method or vacuum evaporation on the insulating film 14, the connection parts 15C and 16C, and the ground layer 28 as shown in FIG. 12. In the embodiment, a material having a small dielectric loss (tan(δ)) is selected as the inorganic insulating layer 30. $SiO_2$ or SiN having a small dielectric loss (tan(δ)) as compared with epoxy-based and polyimide-based insulating resins generally used in a semiconductor device is used as a specific material of the inorganic insulating layer 30. The thickness of the inorganic insulating layer 30 on the ground layer 28 can be formed as a thickness of 1 to 3 μm, for example; particularly, preferably it is set to 1.5 μm.

Figure 13:
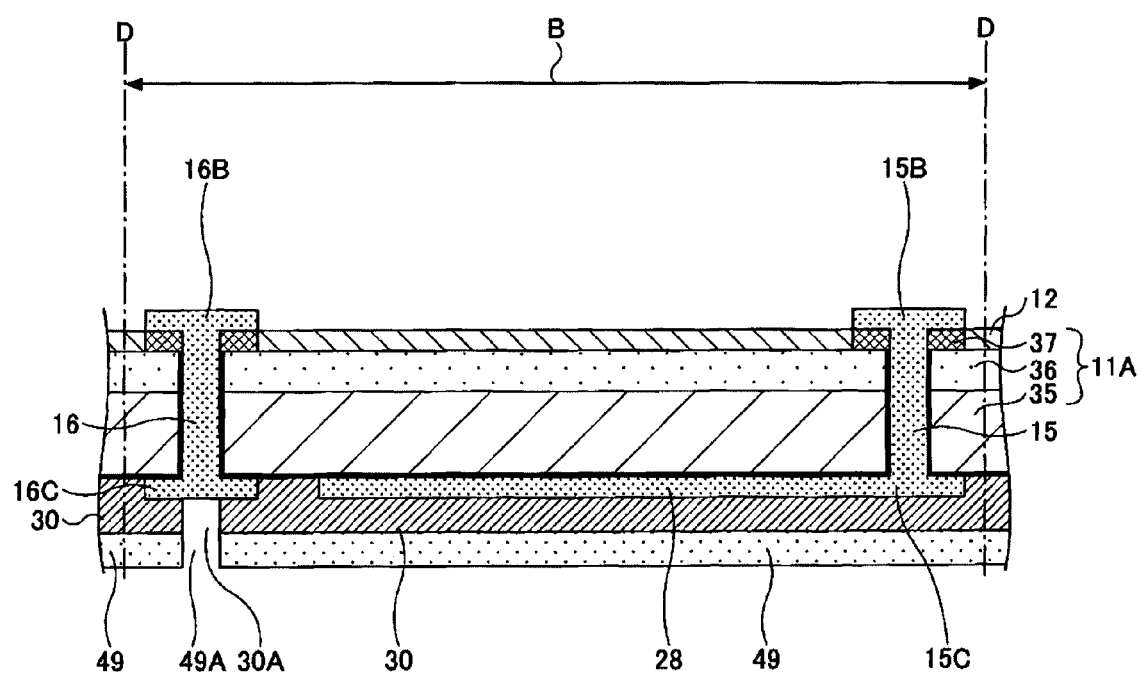
FIG. 13 is a drawing to show the manufacturing process of the semiconductor device according to the first embodiment of the invention (No. 8)

Next, as shown in FIG. 13, a resist layer 49 having an opening 49A is formed at the formation position of a via part 41 forming a part of a patch antenna 33. Subsequently, the inorganic insulating layer 30 is etched with the resist layer 49 as a mask to form a hole 30A in the inorganic insulating layer 30. To etch the inorganic insulating layer 30, a dry etching method can be used, for example. As an alternative method, a laser machining method can also be used. In this case, the resist layer 49 becomes unnecessary. When the hole 30A is formed in the inorganic insulating layer 30, the resist layer 49 is removed using a resist removal liquid.

Figure 14:
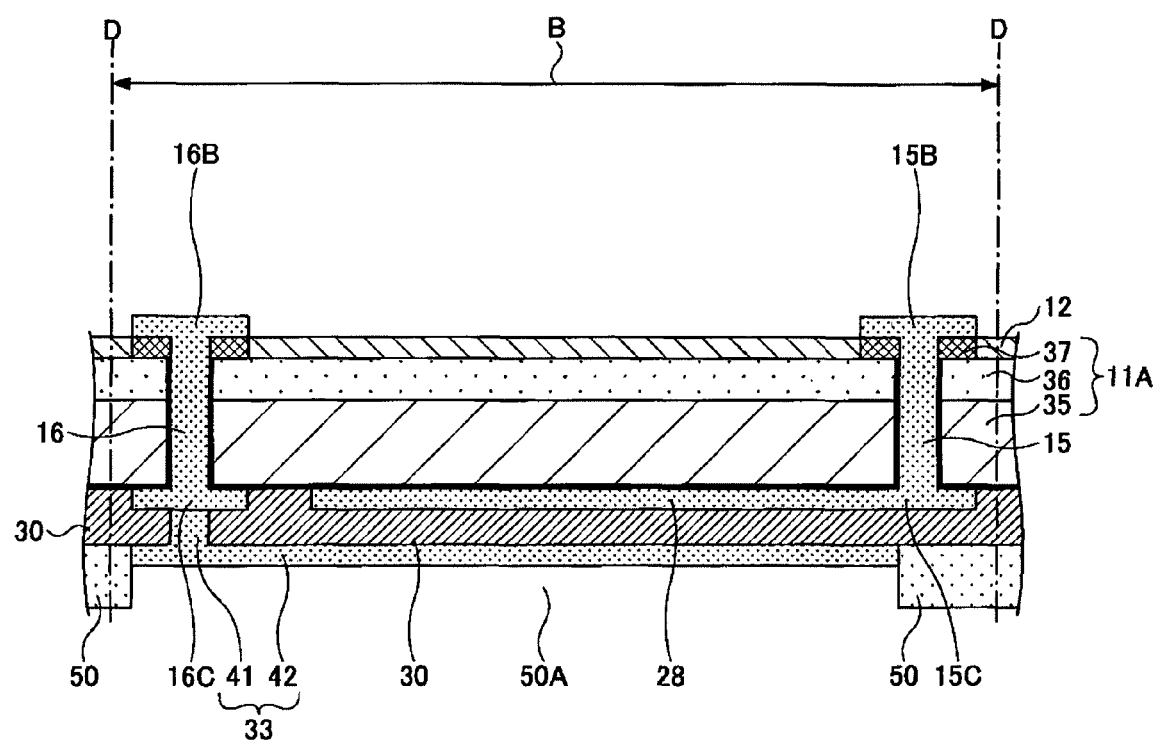
FIG. 14 is a drawing to show a manufacturing process of the semiconductor device according to the first embodiment of the invention (No. 9)

Next, a resist layer 50 having an opening 50A is formed on the top face of the inorganic insulating layer 30 formed with the hole 30A, as shown in FIG. 14. The opening 50A corresponds to the shape of an antenna part 42 forming a part of the patch antenna 33. Then, electrically conductive metal is provided in the opening 50A to continuously form the via part 41 and the antenna part 42 in one piece. After the via part 41 and the antenna part 42 are formed, the resist layer 50 is removed using a resist removal liquid.

Accordingly, the patch antenna 33 made up of the via part 41 and the antenna part 42 is formed. The via part 41 of the patch antenna 33 thus formed is electrically connected to the semiconductor substrate 11A and re-wiring 17B through the through electrode 16.

For example, Cu can be used as electrically conductive metal of a material of the patch antenna 33. The electrically conductive metal can be formed by a plating method, for example. To use an electrolytic plating method, a seed layer made of Cr, Cu, etc., is previously formed on the top face of the inorganic insulating layer 30 and the inner face of the hole 30A by an electrolytic copper plating or a sputtering method and then a resist layer 50 is formed and next the electrically conductive metal is precipitated with the seed layer as a feeding layer. The unnecessary seed layer and the resist layer 50 are removed after the patch antenna 33 is formed.

Figure 15:
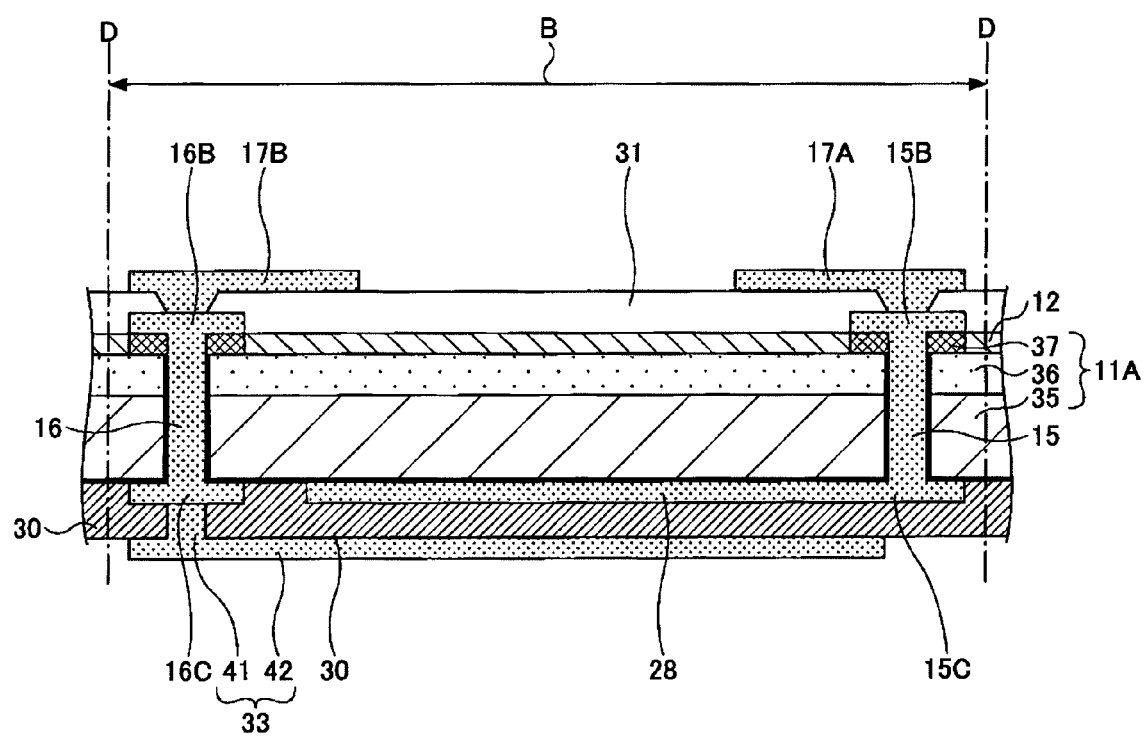
FIG. 15 is a drawing to show the manufacturing process of the semiconductor device according to the first embodiment of the invention (No. 10)

Next, as shown in FIG. 15, an insulating layer 31 is formed on the protective layer 12 and the connection parts 15B and 16B and re-wiring 17A and re-wiring 17B are also formed. A resin of polyimide, epoxy, etc., can be used as the insulating layer 31. The insulating layer 31 can be formed by applying the resin or laying up a resin film.

To form the re-wiring 17A and the re-wiring 17B, first a via is formed using a laser machining method, etc., at a predetermined position opposed to the connection parts 15B and 16B of the insulating layer 31. Then, the re-wiring 17A and the re-wiring 17B are formed using a semi-additive process. The via can be formed by executing a photolithography process if the insulating layer 31 is a photosensitive resin.

Figure 16:
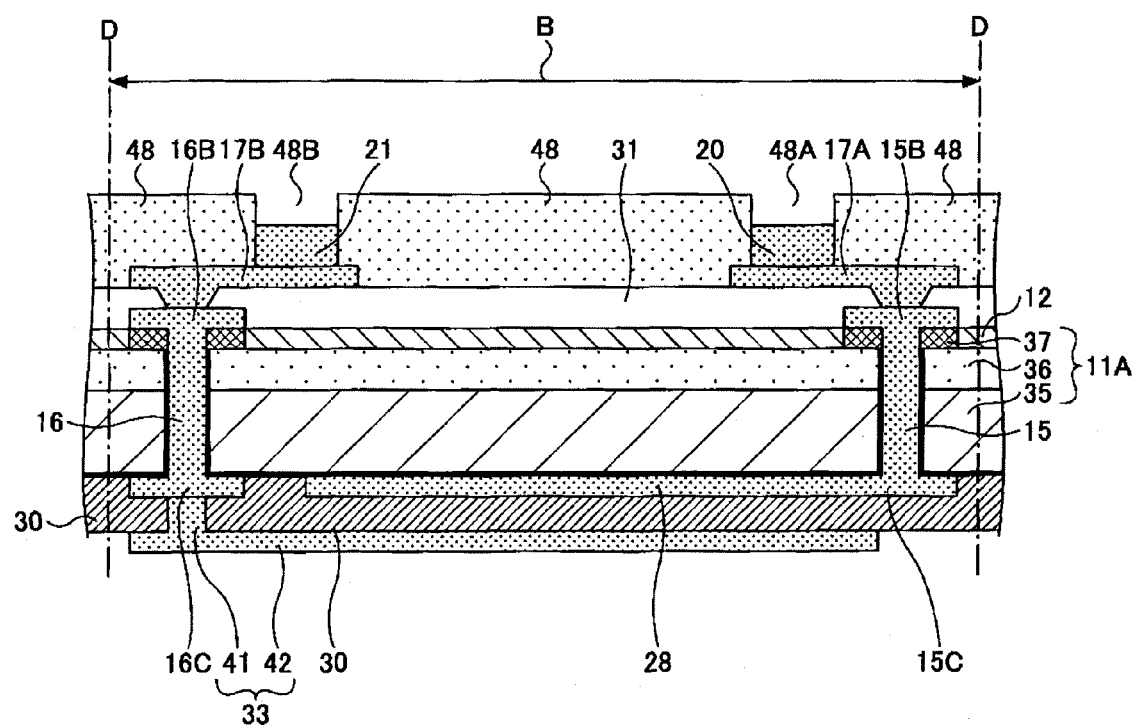
FIG. 16 is a drawing to show the manufacturing process of the semiconductor device according to the first embodiment of the invention (No. 11)

Next, a seed layer of Ti or Cu (not shown) is formed on the top faces of the insulating layer 31 and the re-wiring 17A and the re-wiring 17B by a CVD method and then a resist layer 48 having openings 48A and 48B is formed on the seed layer, as shown in FIG. 16. Electrolytic copper plating is executed with the seed layer as a feeding layer and posts 20 and 21 are formed in the openings 48A and 48B. When the posts 20 and 21 are formed, the resist layer 48 is removed and unnecessary seed layer (seed layer exposed from the posts 20 and 21) is also removed.

Figure 17:
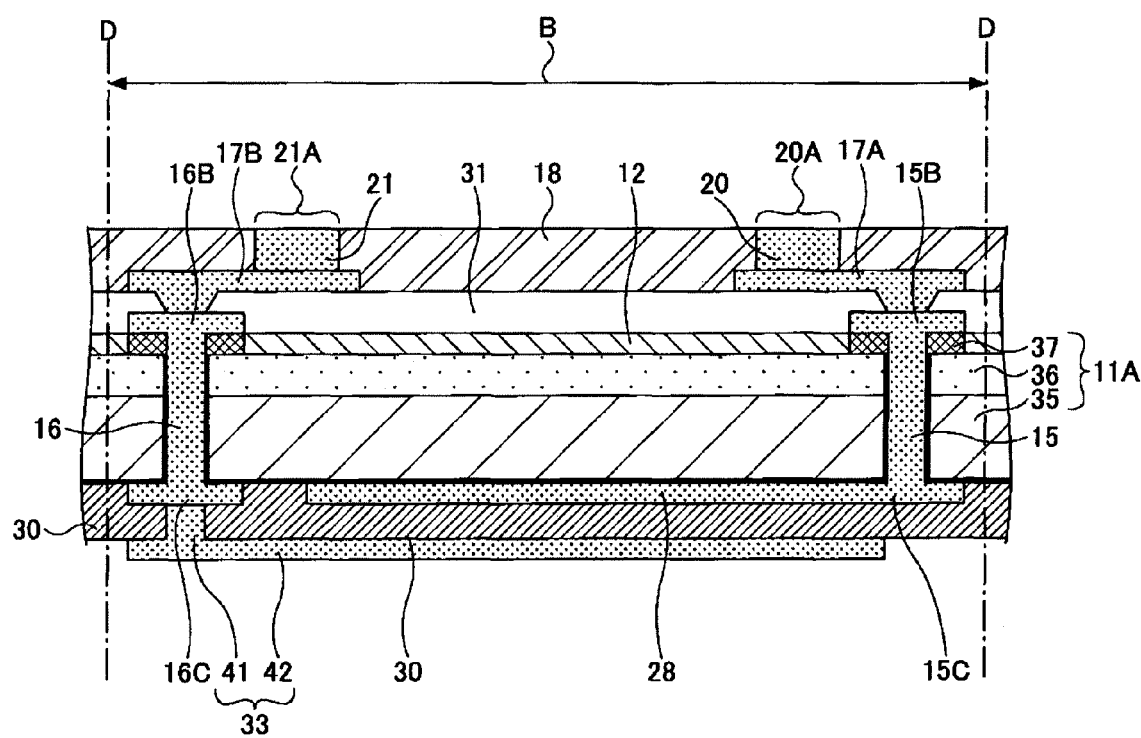
FIG. 17 is a drawing to show the manufacturing process of the semiconductor device according to the first embodiment of the invention (No. 12)

Next, a seal resin 18 roughly flush with upper end faces 20A and 21A of the posts 20 and 21 is formed on the top face of a structure formed with the re-wiring 17A and the re-wiring 17B, as shown in FIG. 17. As the seal resin 18, for example, an epoxy-based resin, a polyimide-based resin, etc., can be used and the seal resin can be formed by a transfer mold method, laying up of a resin film, etc.

Next, a solder resist 22 having openings 22A and 22B is formed on the top face of the seal resin 18. The post 20 is exposed in the opening 22A and the post 21 is exposed in the opening 22B. The solder resist 22 is formed by applying an epoxy-based resin, a polyimide-based resin, etc., for example.

Figure 18:
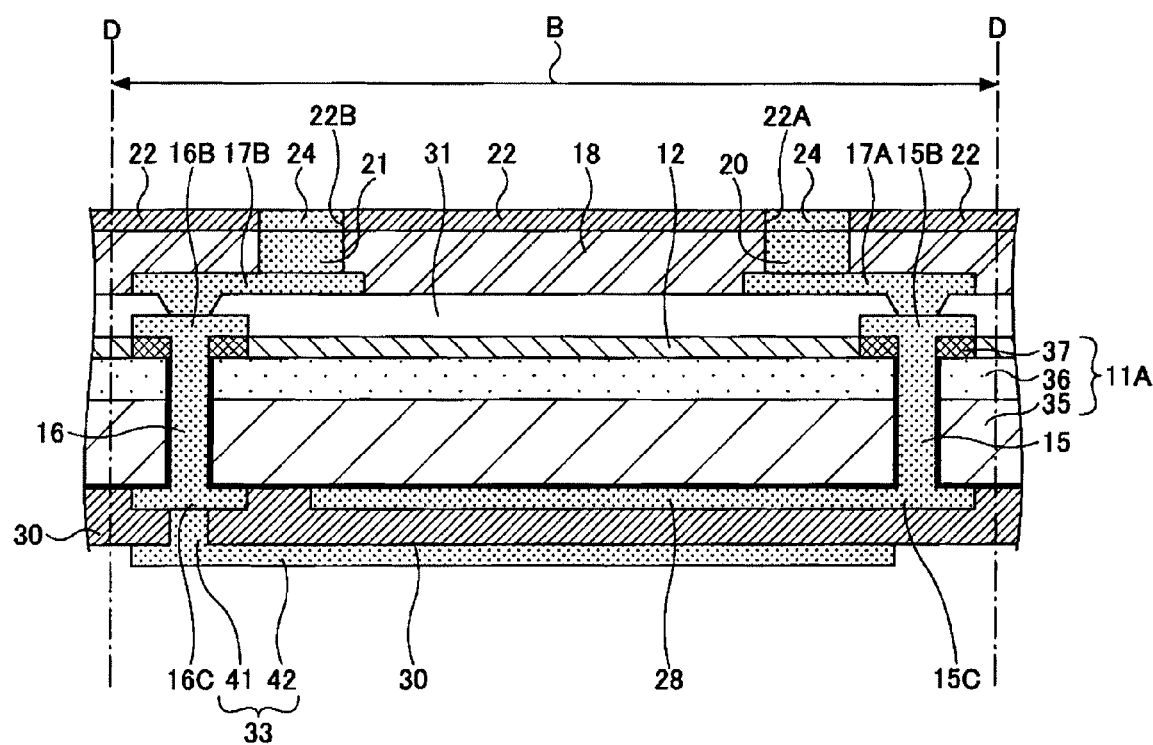
FIG. 18 is a drawing to show the manufacturing process of the semiconductor device according to the first embodiment of the invention (No. 13)
Figure 19:
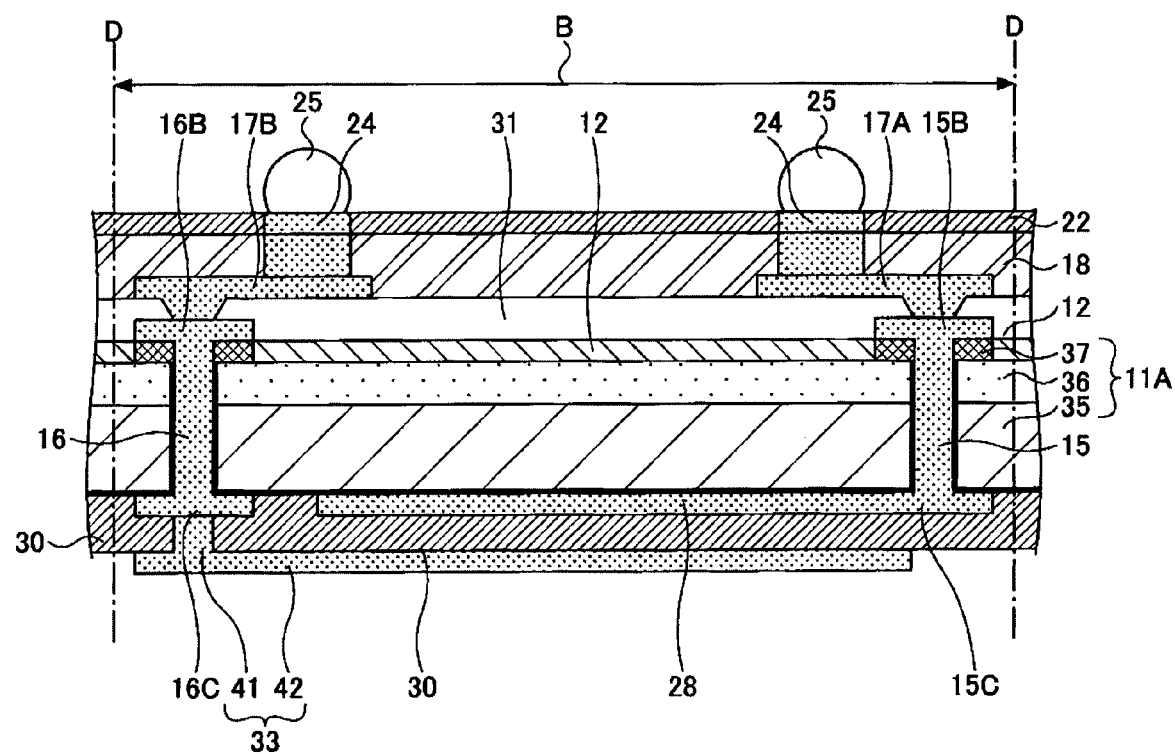
FIG. 19 is a drawing to show the manufacturing process of the semiconductor device according to the first embodiment of the invention (No. 14)
Figure 20:
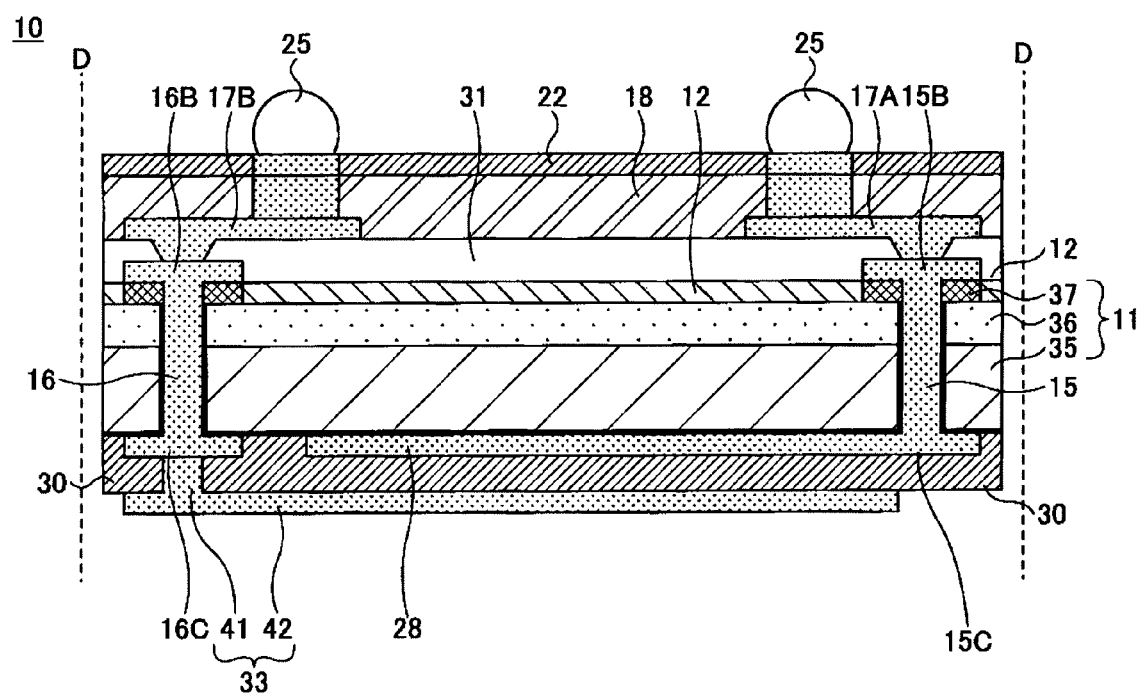
FIG. 20 is a drawing to show the manufacturing process of the semiconductor device according to the first embodiment of the invention (No. 15)

Next, a diffusion prevention film 24 is formed on the posts and 21 exposed to the openings 22A and 22B, as shown in FIG. 18. The diffusion prevention film 24 is formed by depositing an Ni layer and an Au layer in order by an electroless plating method, for example, Next, external connection terminals 25 are formed on the diffusion prevention film 24 as shown in FIG. 19. For example, a solder ball can be used as the external connection terminal 25. Then, as shown in FIG. 20, the semiconductor substrate 11A is cut at cut positions D with a dicing blade, whereby separate semiconductor devices 10A are provided. Accordingly, a plurality of semiconductor devices 10A are manufactured at a time.

According to the manufacturing method of the semiconductor device of the embodiment described above, the semiconductor substrate 11A having a plurality of semiconductor device formation areas B is formed with the element formation layer 36 and then the semiconductor chip 11 is formed with the through electrodes 15 and 16, the patch antenna 33, the external connection terminals 25, etc., and last the semiconductor substrate 11A is cut to manufacture a plurality of semiconductor devices 10A at a time. Thus, the manufacturing cost of the semiconductor device 10A can be reduced.

Although the preferred embodiment of the invention has been described in detail, it is to be understood that the invention is not limited to the specific embodiment described above and that various modifications and changes can be made without departing from the spirit and the scope of the invention as claimed.

For example, in the above embodiments, only one antenna is provided to the semiconductor device; however, a plurality of antennas selected from a group consisting of the patch antenna, an inverted F antenna and a dipole antenna may be provided to the semiconductor device.

Figure 24A:
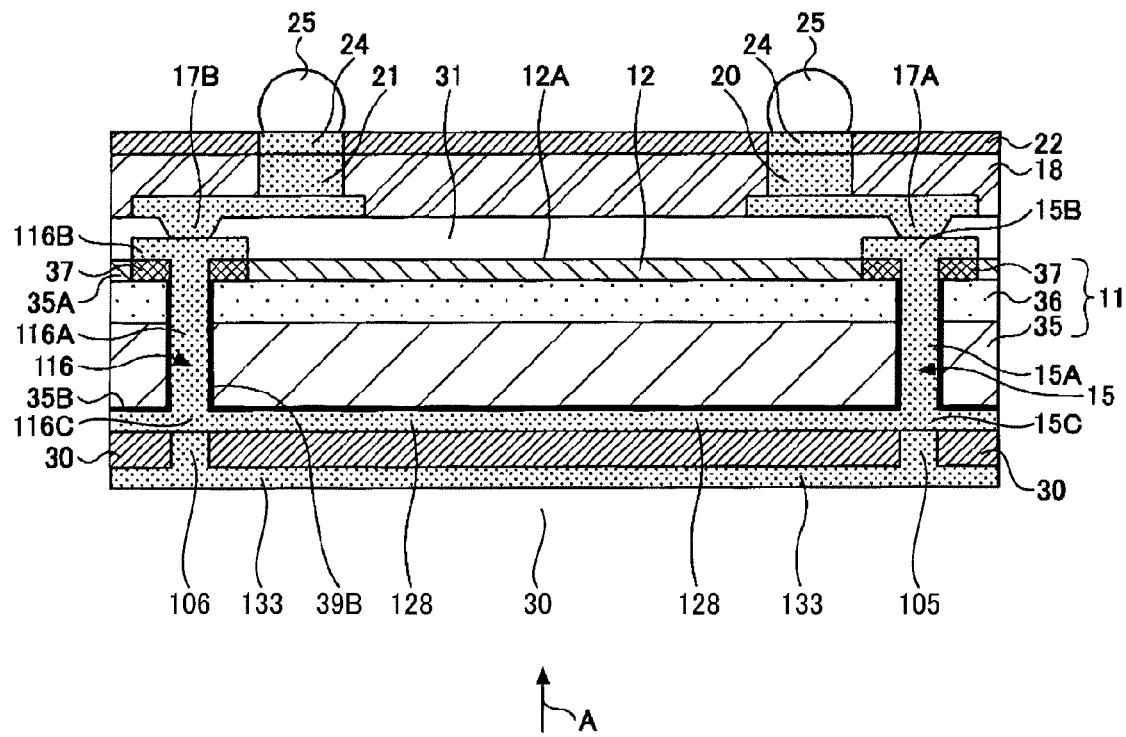
FIG. 24A shows a sectional view of a semiconductor device according to a fifth embodiment of the invention.
Figure 24B:
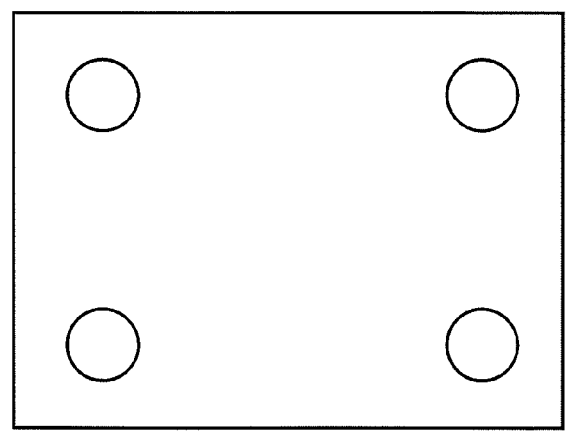
FIG. 24B shows a plan view of the semiconductor device according to the fifth embodiment of the invention.

Further, in place of antenna, a shield layer may be applied as the passive layer in a semiconductor device 10E according to a fifth embodiment of the invention shown in FIGS. 24A and 24B. A ground layer 128 is formed of Cu and is provided on the whole second face 35B of the semiconductor substrate 35. The ground layer 128 is electrically connected to a connection part 15C of the through electrode 15 which is electrically connected to a ground line of a semiconductor element. The ground layer 128 is also electrically connected to a connection part 116C of a through electrode 116 which has a connection part 116B and a through part 116A and is electrically connected to a ground line of the semiconductor element. A shield layer 133 is made of Ni and is provided on the whole second face 35B of the semiconductor substrate 35 through an inorganic insulating layer 30. The shield layer 133 is electrically connected to the ground layer 128 through GND terminals 105 and 106. According to the semiconductor device 10E, since the ground layer 128 is formed of Cu and the shield layer 133 is formed of Ni, the semiconductor device 10E can have a shielding effect that the ground layer 128 shields from the electric field and the shield layer 133 shields from the magnetic field.

What is claimed is:

1. A semiconductor device comprising:
   a semiconductor element;
   first and second through electrodes formed passing through the semiconductor element;
   an inorganic insulating layer formed on an opposite side to a main face of the semiconductor element on which an element formation layer is formed;
   an antenna connected to the first through electrode, a portion of the antenna provided through the inorganic insulating layer on the opposite side to the main face of the semiconductor element; and
   a ground layer electrically connected to the second through electrode connected to a ground line of the semiconductor element, the ground layer provided on the opposite side to the main face of the semiconductor element,
   wherein the inorganic insulating layer is provided directly on the ground layer.

2. The semiconductor device as claimed in claim 1 wherein the inorganic insulating layer is $SiO_2$ or SiN.

3. The semiconductor device as claimed in claim 1 wherein the antenna is selected from the group consisting of a patch antenna, an inverted F antenna, and a dipole antenna.

4. The semiconductor device as claimed in claim 1, further comprising:
   a re-wiring formed on the main face of the semiconductor element.

5. The semiconductor device as claimed in claim 1 wherein a thickness of the inorganic insulating layer is in a range of 1 to 3 μm.

6. The semiconductor device as claimed in claim 1 wherein the antenna is connected to the ground layer.

7. The semiconductor device according to claim 1, wherein the first through electrode is electrically connected to a feed line of the semiconductor element.

8. The semiconductor device according to claim 1, wherein the first through electrode is electrically connected to a ground line of the semiconductor element.

9. The semiconductor device according to claim 1, wherein the antenna is formed directly on the inorganic insulating layer.

* * * * *